US008679892B2

(12) United States Patent
Li et al.

(10) Patent No.: US 8,679,892 B2
(45) Date of Patent: Mar. 25, 2014

(54) METHOD FOR MANUFACTURING SILICON THIN-FILM SOLAR CELLS

(75) Inventors: Tomi T. Li, Jhongli (TW); Jeng-Yang Chang, Jhongli (TW); Sheng-Hui Chen, Jhongli (TW); Cheng-Chung Lee, Jhongli (TW)

(73) Assignee: National Central University, Jhongli, Taoyuan County (TW)

( * ) Notice: Subject to any disclaimer, the term of this patent is extended or adjusted under 35 U.S.C. 154(b) by 155 days.

(21) Appl. No.: 13/343,373

(22) Filed: Jan. 4, 2012

(65) Prior Publication Data

US 2012/0100665 A1 Apr. 26, 2012

(30) Foreign Application Priority Data

Jan. 13, 2011 (TW) .............................. 100101245 A

(51) Int. Cl.
*H01L 21/00* (2006.01)
*H01L 31/0376* (2006.01)
*H01L 31/0384* (2006.01)

(52) U.S. Cl.
CPC ...... *H01L 31/0376* (2013.01); *H01L 31/03845* (2013.01)
USPC .................. 438/87; 438/96; 257/E31.047

(58) Field of Classification Search
USPC ................... 438/87, 96, 97, 98; 257/E31.047
See application file for complete search history.

(56) References Cited

U.S. PATENT DOCUMENTS

| 5,986,204 | A  | * | 11/1999 | Iwasaki et al. | ................ | 136/256 |
| 6,963,120 | B2 | * | 11/2005 | Shiozaki et al. | ............... | 257/458 |
| 2011/0000537 | A1 | * | 1/2011 | Myong | ......................... | 136/256 |
| 2011/0203657 | A1 | * | 8/2011 | Kim et al. | ...................... | 136/256 |
| 2011/0232732 | A1 | * | 9/2011 | Myong | ......................... | 136/255 |

* cited by examiner

*Primary Examiner* — Michael Trinh
(74) *Attorney, Agent, or Firm* — Muncy, Geissler, Olds & Lowe, P.C.

(57) ABSTRACT

The present invention relates to a method for manufacturing silicon thin-film solar cells, including: providing a substrate; forming a first electrode on the substrate; forming a first doped semiconductor layer on the first electrode by chemical vapor deposition; forming an intrinsic layer on the first doped semiconductor layer by chemical vapor deposition, where the intrinsic layer includes a plurality of amorphous/nanocrystalline silicon layers, and the intrinsic layer has various energy bandgaps formed by varying average grain sizes of the amorphous/nanocrystalline silicon layers; forming a second doped semiconductor layer on the intrinsic layer by chemical vapor deposition, where one of the first doped semiconductor layer and the second doped semiconductor layer is a p-type amorphous silicon layer and the other is an n-type amorphous/nano-microcrystalline silicon layer; and forming a second electrode on the second doped semiconductor layer. Accordingly, the present invention can achieve broadband absorption in a single junction structure.

18 Claims, 9 Drawing Sheets

METHOD FOR MANUFACTURING SILICON THIN-FILM SOLAR CELLS

CROSS REFERENCE TO RELATED APPLICATION

This application claims the benefits of the Taiwan Patent Application Serial No. 100101245, filed on Jan. 13, 2011, the subject matter of which is incorporated herein by reference.

BACKGROUND OF THE INVENTION

1. Field of the Invention

The present invention relates to a method for manufacturing silicon thin-film solar cells, more particularly, to a method for manufacturing silicon thin-film solar cells with graded bandgaps.

2. Description of Related Art

Due to the finite nature of conventional energy such as petroleum and coal, alternative forms of energy have been developed to replace the conventional energy. Among all the forms of alternative energy, solar energy is abundant and environmentally friendly, so research about solar cells has been vigorously pursued. The solar cell is a photovoltaic device to convert light into electricity, and the structurally simplest solar cell is a single junction solar cell. As shown in FIG. 1, a single junction solar cell includes: a substrate 11, a first electrode 12, a p-type semiconductor layer 13, an intrinsic layer 14, an n-type semiconductor layer 15, and a second electrode 16. Accordingly, when sunlight passes through the substrate 11 and the first electrode 12, the PIN junction would absorb light and thus separates electrons and holes. Subsequently, under the intrinsic electric field, the obtained electrons and holes would move to the n-type and p-type semiconductor layers respectively to contribute current. Finally, the current is derived out through electrodes to form electricity for usage or storage.

Silicon solar cells are the major commercially used solar cells. Among them, amorphous silicon solar cells can be fabricated in lower cost, but exhibit lower photoelectric conversion efficiency than monocrystalline or polycrystalline silicon solar cells and have the drawback of photodegradation. In order to resolve the problems, microcrystalline silicon solar cells with inhibited photodegradation have been developed.

Additionally, in order to achieve broadband absorption and improved photoelectric conversion efficiency, tandem solar cells have been suggested, such as double junction and triple junction solar cells. FIG. 2 shows a cross-sectional view of a conventional double junction silicon solar cell. As shown in FIG. 2, in the double-junction silicon solar cell, the second microcrystalline silicon PIN junction unit (including a second p-type semiconductor layer 23', a second intrinsic layer 24' and a second n-type semiconductor layer 25') is formed on the first amorphous silicon PIN junction unit (including a first p-type semiconductor layer 23, a first intrinsic layer 24 and a first n-type semiconductor layer 25) on the first electrode 22. Accordingly, the first amorphous silicon PIN junction unit can absorb light of 350 nm to 800 nm, while the second microcrystalline silicon PIN junction unit can absorb light of 350 nm to 1200 nm, resulting in broadband absorption and enhanced photoelectric conversion efficiency. Moreover, in order to further enhance the photoelectric conversion efficiency, an intermediate layer 27 may be formed between the first amorphous silicon PIN junction unit and the second microcrystalline silicon PIN junction unit to increase the reflection of light.

Although broadband absorption can be achieved by stacking PIN junction units of different bandgaps, the choice of material used in the tandem solar cells is limited in consideration of current matching, and the method for fabricating the tandem solar cells is more complex. Additionally, the manufacture of the intermediate layer for the enhancement of the photoelectric conversion efficiency is difficult and causes an increase in manufacturing cost.

SUMMARY OF THE INVENTION

The object of the present invention is to provide a method for manufacturing a silicon thin-film solar cell, which has an absorption layer with graded bandgaps and can achieve broadband absorption in a single-junction structure.

To achieve the object, the present invention provides a method for manufacturing a silicon thin-film solar cell, including: providing a substrate; forming a first electrode on the substrate; forming a first doped semiconductor layer on the first electrode by chemical vapor deposition; forming an intrinsic layer on the first doped semiconductor layer by chemical vapor deposition, where the intrinsic layer includes a plurality of amorphous/nanocrystalline silicon layers, and the intrinsic layer has various energy bandgaps formed by varying average grain sizes of the amorphous/nanocrystalline silicon layers; forming a second doped semiconductor layer on the intrinsic layer by chemical vapor deposition, in which one of the first doped semiconductor layer and the second doped semiconductor layer is a p-type amorphous silicon layer and the other is an n-type amorphous/nano-microcrystalline silicon layer; and forming a second electrode on the second doped semiconductor layer.

According to the present invention, an intrinsic layer with graded bandgaps is formed by varying average grain sizes of the amorphous/nanocrystalline silicon layers, such that solar cells with broadband absorption and enhanced photoelectric conversion efficiency can be obtained. Compared to tandem solar cells, the present invention can achieve broadband absorption in a single-junction structure, and thereby the issue of current matching necessarily considered in tandem solar cells is non-existent. In particular, the present invention has the advantages of simple process and low cost.

In the present invention, examples of the chemical vapor deposition include, but are not limited to, electron cyclotron plasma-enhanced chemical vapor deposition (ECR-CVD), plasma-enhanced chemical vapor deposition (PECVD), hot-wire chemical vapor deposition (HW-CVD), low pressure chemical vapor deposition (LPCVD), and very high frequency-plasma enhanced chemical vapor deposition (VHF-PECVD).

In the present invention, preferably, the amorphous/nanocrystalline silicon layers are formed by ECR-CVD, and the preferred conditions for forming them are set as follows: the deposition temperature of about 60° C. to 350° C., the microwave power of about 500 W to 1500 W (more preferably, about 700 W to 1500 W), the deposition pressure of about 1 mTorr to 30 mTorr (more preferably, about 10 mTorr to 30 mTorr), and the flow ratio of $H_2$/(silicon source+$H_2$) of about 0% to 98% (more preferably, about 90% to 98%). Herein, the silicon source may be $SiH_4$. Preferably, the $H_2$ flow ranges from about 0 sccm to 300 sccm (more preferably, about 45 sccm to 200 sccm; the flow of the silicon source ranges from about 5 sccm to 30 sccm (more preferably, about 5 sccm to 10 sccm); and the flow of the carrier gas (such as He, Ar) ranges from about 10 sccm to 30 sccm.

In the present invention, the variation of the amorphous/nanocrystalline silicon layers in average grain sizes can be achieved by varying at least one process parameter, for example, flow ratio of $H_2$/(silicon source+$H_2$), microwave power, both flow ratio of $H_2$/(silicon source+$H_2$) and deposition temperature under $CF_4$ flow (the $CF_4$ flow may be about 2 sccm to 5 sccm), both microwave power and deposition temperature, or both microwave power and deposition pressure. In addition, after growing each amorphous/nanocrystalline silicon layer, a process of rapid thermal annealing (RTA) may be optionally performed to stabilize grain size and uniformity. Herein, the RTA process may be performed at about 650-850° C. for about 1-2 minutes.

In the present invention, the bandgaps of the intrinsic layer may vary in an increasing trend, a decreasing trend, or a decreasing and then increasing trend from the p-type amorphous silicon layer to the n-type amorphous/nano-microcrystalline layer. In the aspect of the gradually decreasing trend and the aspect of the gradually increasing trend, all amorphous/nanocrystalline silicon layers can have the same thickness. Meanwhile, in the aspect of the gradually decreasing and then gradually increasing trend, the amorphous/nanocrystalline silicon layer adjacent to the p-type amorphous silicon layer may have a larger bandgap than the amorphous/nanocrystalline silicon layer adjacent to the n-type amorphous/nano-microcrystalline silicon layer; or the amorphous/nanocrystalline silicon layer adjacent to the p-type amorphous silicon layer may have a smaller bandgap than the amorphous/nanocrystalline silicon layer adjacent to the n-type amorphous/nano-microcrystalline silicon layer; or the amorphous/nanocrystalline silicon layer adjacent to the p-type amorphous silicon layer may have the same bandgap as the amorphous/nanocrystalline silicon layer adjacent to the n-type amorphous/nano-microcrystalline silicon layer. Herein, in the aspect of the decreasing and then increasing trend, all amorphous/nanocrystalline silicon layers may have the same thickness (i.e. the bandgaps are varied in an approximate V-shaped trend); or the amorphous/nanocrystalline silicon layer with the lowest bandgap may have the largest thickness and other amorphous/nanocrystalline silicon layers have the same thickness (i.e. the bandgaps are varied in an approximate U-shaped trend). Preferably, the bangap of the intrinsic layer is varied in an approximate U-shaped trend.

In the present invention, preferably, the intrinsic layer includes at least three amorphous/nanocrystalline silicon layers, where each amorphous/nanocrystalline silicon layer may range from about 500 Å to 5000 Å in thickness. Accordingly, the intrinsic layer may have a thickness from about 1500 Å to 15000 Å, preferably from about 2500 Å to 8500 Å.

In the present invention, the p-type amorphous silicon layer may be doped with group III elements, and preferably is formed by ECR-CVD, in which the preferred conditions are set as follows: the deposition temperature of about 60° C. to 450° C., the microwave power of about 500 W to 1500 W, the deposition pressure of about 1 mTorr to 30 mTorr, the flow ratio of $H_2$/(silicon source+$H_2$) of about 0% to 98% (the silicon source may be $SiH_4$), and the dopant (such as $B_2H_6$)-containing gas flow of about 5 sccm to 30 sccm (preferably 5 sccm to 15 sccm). Herein, the dopant-containing gas preferably is a carrier gas (such as He, Ar) containing dopant in about 90%-98%. Additionally, the total flow of the silicon source and $H_2$ gas preferably ranges from 50 sccm to 250 sccm, while the flow of the carrier gas (such as He, Ar) preferably ranges from 10 sccm to 20 sccm. Preferably, the p-type amorphous silicon layer has a thickness from about 50 Å to 500 Å.

In the present invention, the n-type amorphous/nano-microcrystalline silicon layer may be doped with group V elements, and preferably is formed by ECR-CVD, in which the preferred conditions are set as follows: the deposition temperature of about 60° C. to 450° C., the microwave power of about 500 W to 1500 W, the deposition pressure of about 1 mTorr to 30 mTorr, the flow ratio of $H_2$/(silicon source+$H_2$) of about 0% to 98% (the silicon source may be $SiH_4$), and the dopant (such as $PH_3$)-containing gas flow of about 5 sccm to 30 sccm (preferably 5 sccm to 15 sccm). In addition, after forming the n-type amorphous/nano-microcrystalline silicon layer, a RTA process may be optionally performed to stabilize grain size and uniformity. Herein, the RTA process may be performed at about 650-850° C. for about 1-2 minutes. The dopant-containing gas preferably is a carrier gas (such as He, Ar) containing dopant in about 0.5%-2% (more preferably about 0.5%-1%). Additionally, the total flow of the silicon source and $H_2$ gas preferably ranges from 200 sccm to 250 sccm, while the flow of the carrier gas (such as He, Ar) preferably ranges from 10 sccm to 20 sccm. Preferably, the n-type amorphous/nano-microcrystalline silicon layer has a thickness from about 50 Å to 500 Å.

In the present invention, the p-type amorphous silicon layer may have a bandgap from about 1.5 ev to 1.9 ev.

In the present invention, each amorphous/nanocrystalline silicon layers of the intrinsic layer may be a layer of an amorphous silicon phase embedded with nanocrystalline silicon particles with an average grain size from about 20 Å to 200 Å (preferably about 80 Å to 180 Å), and may have a bandgap from about 1.3 ev to 1.7 ev.

In the present invention, the n-type amorphous/nano-microcrystalline silicon layer may be a layer of an n-type amorphous silicon phase embedded with nano-microcrystalline silicon particles with an average grain size from about 20 Å to 400 Å, and may have a bandgap from about 1.1 ev to 1.9 ev.

In the present invention, the substrate, the first electrode and the second electrode are not particularly limited, and may be any suitable conventional substrate and electrode. For example, when the silicon thin-film solar cell of the present invention is constructed in a superstate structure, the first doped semiconductor layer may be a p-type amorphous silicon layer; the second doped semiconductor layer may be an n-type amorphous/nano-microcrystalline silicon layer; the substrate may be a transparent substrate (such as a glass substrate, a plastic substrate); the first electrode may use a transparent conductive material, therewith the first electrode preferably being a first transparent conductive oxide layer (such as a zinc oxide layer, a tin oxide layer, an indium tin oxide layer) to allow incident light to pass through the substrate and the first electrode; and the second electrode may be a second transparent conductive oxide layer (such as a zinc oxide layer, a tin oxide layer, an indium tin oxide layer) or a metal layer (such as a silver layer, an aluminum layer, a copper layer), or the second electrode preferably includes a second transparent conductive oxide layer (such as a zinc oxide layer, a tin oxide layer, an indium tin oxide layer) and a metal layer (such as a silver layer, an aluminum layer, a copper layer), therewith the second transparent conductive oxide layer being formed between the metal layer and the n-type amorphous/nano-microcrystalline silicon layer. In the case of the silicon thin-film solar cell according to the present invention being constructed in a substrate structure, the first doped semicondutctor layer may be an n-type amorphous/nano-microcrystalline silicon layer; the second doped semiconductor layer may be a p-type amorphous silicon layer; the substrate may be an opaque substrate (such as a stainless steel substrate, a metal substrate); the first electrode may be a first transparent conductive oxide layer (such as a zinc oxide layer, a tin oxide layer, an indium tin oxide layer) or a metal layer (such as a silver layer, an aluminum layer, a copper layer), or the first electrode preferably includes a first transparent conductive oxide layer (such as a zinc oxide layer, a tin oxide layer, an indium tin oxide layer) and a metal layer (such as a silver layer, an aluminum layer, a copper layer), therewith the first transparent conductive oxide layer being formed between the metal layer and the n-type amorphous/nano-microcrystalline silicon layer; and the second electrode may use a transparent conductive material, therewith the second electrode preferably being a second transparent conductive oxide layer (such as a zinc oxide layer, a tin oxide layer, an indium tin oxide layer) to allow incident light to pass through the second electrode.

As above-mentioned, in the present invention, an intrinsic layer with graded bandgaps is formed by varying average grain sizes of the amorphous/nanocrystalline silicon layers, such that solar cells with broadband absorption and enhanced photoelectric conversion efficiency can be obtained. Compared to tandem solar cells, the present invention can achieve broadband absorption in a single junction structure, and thereby the issue of current matching necessarily considered in tandem solar cells is non-existent. In particular, the present invention has the advantages of simple process and low cost. Moreover, in the present invention, the p-type amorphous silicon layer, the amorphous/nanocrystalline silicon layers and the n-type amorphous/nano-microcrystalline silicon layer preferably are formed by ECR-CVD, which has the advantages of low temperature deposition, high plasma density and high deposition rate. Compared to PECVD, by which nano-microcrystalline silicon is grown at an excessively low rate, multilayered thin film is difficult to obtain, and the interface between thin films cannot be easily controlled, the silicon thin-film solar cell according to the present invention can be manufactured by ECR-CVD in low cost, high efficiency and high throughput.

DETAILED DESCRIPTION OF THE PREFERRED EMBODIMENT

Hereafter, examples will be provided to illustrate the embodiments of the present invention. Other advantages and effects of the invention will become more apparent from the disclosure of the present invention. Additional various aspects also may be practiced or applied in the invention, and various modifications and variations can be made without departing from the spirit of the invention based on various concepts and applications.

In the following examples, a p-type amorphous silicon layer, amorphous/nanocrystalline silicon layers, and an n-type amorphous/nano-microcrystalline silicon layer were formed by electron cyclotron resonance chemical vapor deposition (ECRCVD). Herein, the amorphous/nanocrystalline silicon layers were formed in the condition as follows: the substrate temperature of about 60° C. to 350° C., the microwave power of about 500 W to 1500 W, the deposition pressure of about 1 mTorr to 30 mTorr, the He flow of about 10 sccm to 30 sccm, the $SiH_4$ flow of about 5 sccm to 30 sccm, and the $H_2$ flow of about 0 sccm to 300 sccm (i.e. $H_2/SiH_4+H_2$ of about 0% to 98%). Additionally, in the following examples, the variation of the amorphous/nanocrystalline silicon layers in average grain sizes can be achieved by altering (1) the ratio of silicon source to hydrogen, (2) the microwave power, (3) the ratio of silicon source to hydrogen and deposition temperature under $CF_4$ flow of about 2 sccm to 5 sccm, (4) microwave power and deposition temperature, or (5) microwave power and deposition pressure, such that an intrinsic layer with graded bandgaps can be formed. Moreover, the following examples used an alpha-step profilometer (veeco dektak 6M) to measure the thickness of each thin film and a Raman spectrometer (Raman Imaging Microscope System 1000, available from RENISHAW Co.) to qualitatively analyze the crystal quality and atomic bonding of each silicon film. A board peak can be found at about 480 $cm^{-1}$ for amorphous silicon phase, while a sharp peak would be found at about 510-520 $cm^{-1}$ for nanocrystalline or microcrystalline phase. Furthermore, the following examples used an X-ray diffractometer (D & DISCOVER X-ray Diffractometer, available from BRUKER Co.) with a Cu K$\alpha$ (1.54056 Å) to observe the crystal and to determine its grain size by Scherrer's equation.

EXAMPLE 1

FIGS. 3A to 3G show cross-sectional views for illustrating the method for manufacturing a silicon thin-film solar cell according to the present example.

Figure 1:
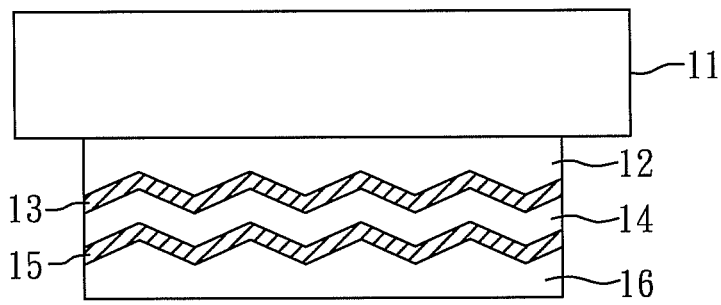
FIG. 1 shows a cross-sectional view of a conventional single junction solar cell.
Figure 2:
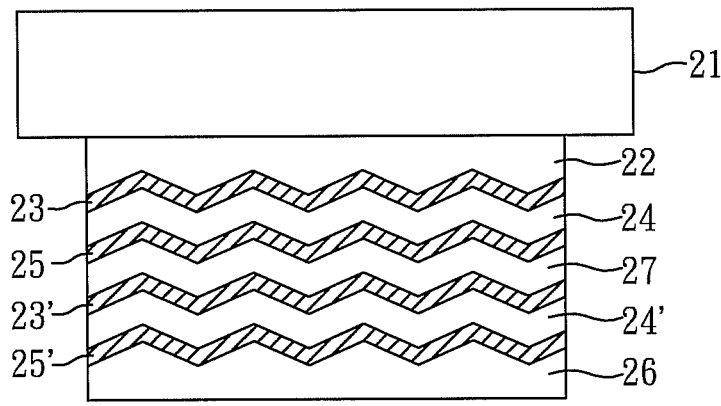
FIG. 2 shows a cross-sectional view of a conventional double junction solar cell.
Figure 3A:
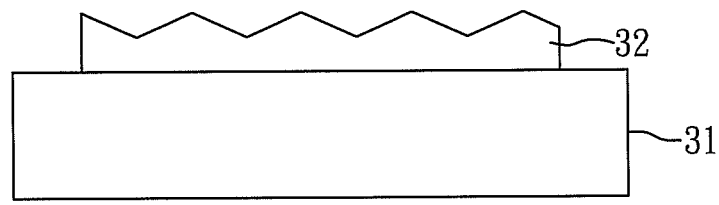
FIGS. 3A to 3G show cross-sectional views for illustrating a method for manufacturing a silicon thin-film silicon solar cell according to one preferred example of the present invention.

As shown in FIG. 3A, a substrate 31 was first provided and a first electrode 32 was formed on the substrate 31. In the present example, a transparent glass substrate was utilized as the substrate 31, and transparent ITO material was coated on the substrate 31 by sputtering to form a first transparent conductive oxide layer as the first electrode 32. Accordingly, incident light can pass through the substrate 31 and the first electrode 32.

Next, the present example utilized electron cyclotron resonance chemical vapor deposition (ECRCVD) to grow the subsequent silicon thin films.

Figure 3B:
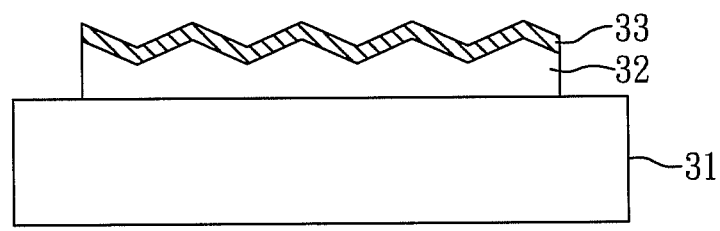

As shown in FIG. 3B, a first doped semiconductor layer 33 was formed on the first electrode 32 by ECRCVD. In detail, a p-type amorphous silicon layer was grown as the first doped semiconductor layer 33 in the condition as follows: the substrate temperature of about 250° C., the microwave power of about 1000 W, the deposition pressure of about 20 mTorr, the He flow of about 20 sccm, the $H_2$ flow of about 80 sccm, the $SiH_4$ flow of about 10 sccm, and the $B_2H_6$:He (98:2) flow of about 5-15 sccm. Accordingly, the present example manufactured a first doped semiconductor layer 33 (i.e. a p-type amorphous silicon layer) of about 500 Å in thickness and about 1.7 eV in bangap.

Figure 3C:
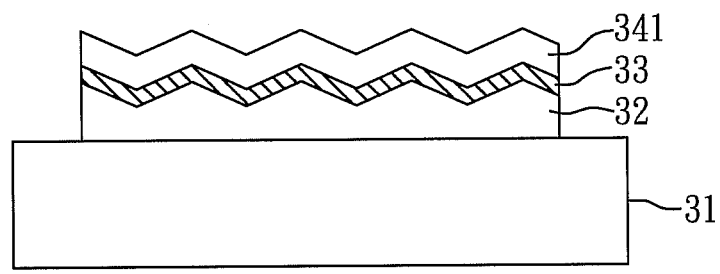
Figure 3D:
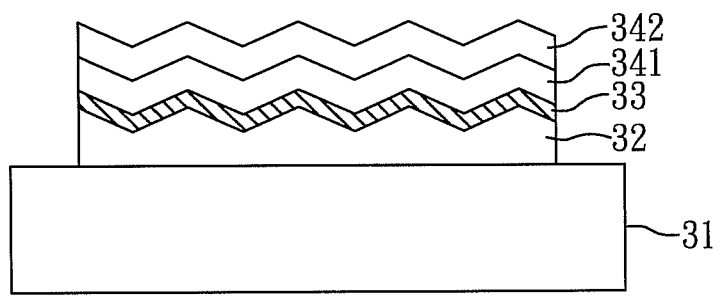
Figure 3E:
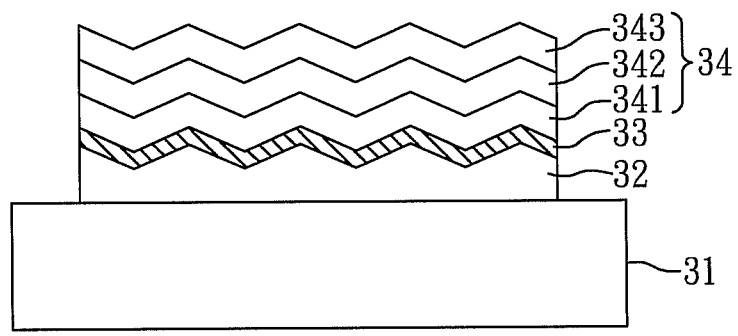

Subsequently, as shown in FIGS. 3C to 3E, the present example utilized ECRCVD and modified the ratio of $SiH_4$:$H_2$ to form an intrinsic layer 34 with graded bandgaps on the first doped semiconductor layer 33. In detail, a first amorphous/nanocrystalline silicon layer 341, a second amorphous/nanocrystalline silicon layer 342 and a third amorphous/nanocrystalline silicon layer 343 with increasing average grain sizes were formed on the p-type amorphous silicon layer in sequence by increasing the ratio of $H_2/SiH_4+H_2$ in a constant condition as follows: the substrate temperature of about 250° C., the microwave power of about 1200 W, the deposition pressure of about 20 mTorr and the He flow of about 16 sccm. Herein, the first amorphous/nanocrystalline silicon layer 341 of about 1000 Å in thickness, about 80-100 Å in average grain size and about 1.6 eV in bandgap was grown in the condition of $SiH_4$ and $H_2$ respectively being about 5 sccm and 45 sccm (i.e. $H_2/SiH_4+H_2$ being 90%); the second amorphous/nanocrystalline silicon layer 342 of about 1000 Å in thickness, about 100-120 Å in average grain size and about 1.4-1.5 eV in bandgap was grown in the condition of $SiH_4$ and $H_2$ respectively being about 5 sccm and 47 sccm (i.e. $H_2/SiH_4+H_2$ being 90.4%); and the third amorphous/nanocrystalline silicon layer 343 of about 1000 Å in thickness, about 150-180 Å in average grain size and about 1.3 eV in bandgap was grown in the condition of $SiH_4$ and $H_2$ respectively being about 5 sccm and 50 sccm (i.e. $H_2/SiH_4+H_2$ being 91%). In addition, after forming the first amorphous/nanocrystalline silicon layer 341, the second amorphous/nanocrystalline silicon layer 342 and the third amorphous/nanocrystalline silicon layer 343, a process of rapid thermal annealing (RTA) can be optionally performed to stabilize the grain size and uniformity. In RTA, the temperature was set in the range from about 650° C. to 850° C., and the process time was about 1.5 minutes. Accordingly, the present example manufactured an intrinsic layer 34 with gradually decreasing bandgaps from the side of the p-type amorphous silicon layer in a thickness of about 3000 Å.

Figure 3F:
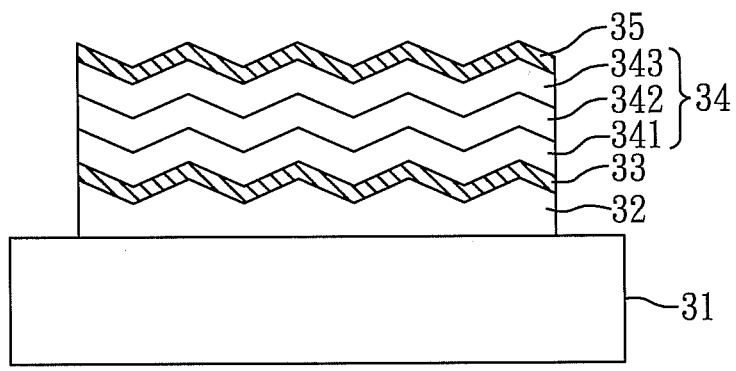

Then, as shown FIG. 3F, a second doped semiconductor layer 35 was formed on the intrinsic layer 34 by ECRCVD. In detail, an n-type amorphous/nano-microcrystalline silicon layer of about 300 Å in thickness was grown as the second doped semiconductor layer 35 in the condition as follows: the substrate temperature of about 250° C., the microwave power of about 1500 W, the deposition pressure of about 20 mTorr, the He flow of about 20 sccm, the $H_2$ flow of about 60 sccm, the $SiH_4$ flow of about 5 sccm, and the $PH_3$:He (1:98) flow of about 5-15 sccm. In addition, after forming the n-type amorphous/nano-microcrystalline silicon layer, a process of rapid thermal annealing (RTA) can be optionally performed to stabilize the grain size and uniformity. In RTA, the temperature was set in the range from about 650° C. to 850° C., and the process time was about 1.5 minutes. Accordingly, the present example manufactured an n-type amorphous/nano-microcrystalline silicon layer of about 300 Å in thickness, about 1.2 eV in bandgap and 250 Å in average grain size as the second doped semiconductor layer 35.

Figure 3G:
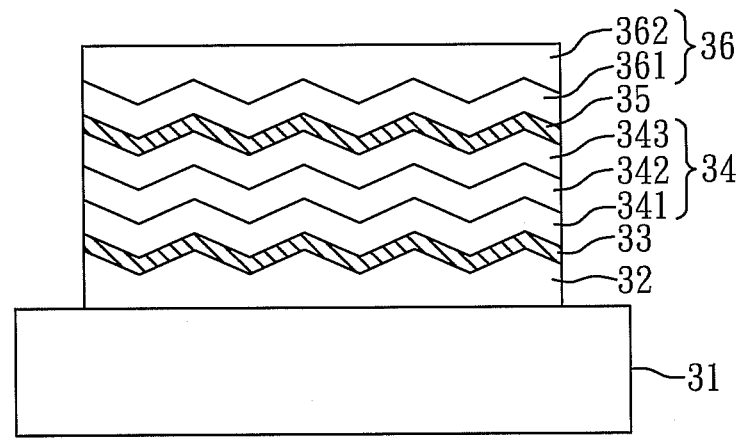

Finally, as shown in FIG. 3G, a second electrode 36 was formed on the second doped semiconductor layer 35. Herein, ITO (i.e. a second transparent oxide layer 361) and Al (i.e. a metal layer 362) were coated on the second doped semiconductor layer 35 by sputtering to form as the second electrode 36.

EXAMPLE 2

FIGS. 4A to 4E show cross-sectional views for illustrating the method for manufacturing a silicon thin-film solar cell according to the present example.

Figure 4A:
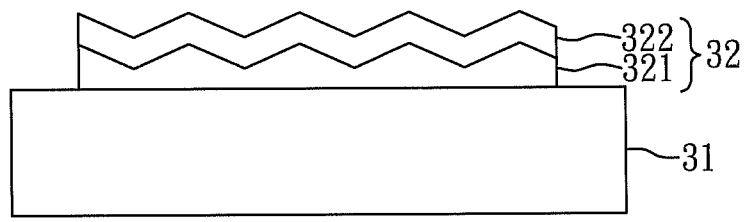
FIGS. 4A to 4E show cross-sectional views for illustrating a method for manufacturing a silicon thin-film silicon solar cell according to another preferred example of the present invention.

As shown in FIG. 4A, a substrate 31 was first provided and a first electrode 32 was formed on the substrate 31. In the present example, a stainless steel substrate was utilized as the substrate 31, and Ag (i.e. a metal layer 321) and ZnO (i.e. a first transparent oxide layer 322) were coated on the substrate 31 by sputtering to form the first electrode 32.

Next, the present example utilized electron cyclotron resonance chemical vapor deposition (ECRCVD) to grow the subsequent silicon thin films.

Figure 4B:
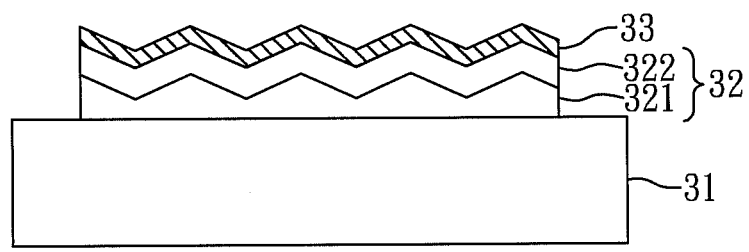

As shown in FIG. 4B, a first doped semiconductor layer 33 was formed on the first electrode 32 by ECRCVD. In detail, an n-type amorphous/nano-microcrystalline silicon layer of 300 Å in thickness was grown as the first doped semiconductor layer 33 in the condition as follows: the substrate temperature of about 250° C., the microwave power of about 1500 W, the deposition pressure of about 20 mTorr, the He flow of about 20 sccm, the $H_2$ flow of about 60 sccm, the $SiH_4$ flow of about 5 sccm, and the $PH_3$:He (1:98) flow of about 5-15 sccm. In addition, after forming the n-type amorphous/nano-microcrystalline silicon layer, a process of rapid thermal annealing (RTA) can be optionally performed to stabilize the grain size and uniformity. In RTA, the temperature was set in the range from about 650° C. to 850° C., and the process time was about 1.5 minutes. Accordingly, the present example manufactured an n-type amorphous/nano-microcrystalline silicon layer of about 300 Å in thickness, about 1.2 eV in bandgap and 250 Å in average grain size as the first doped semiconductor layer 33.

Figure 4C:
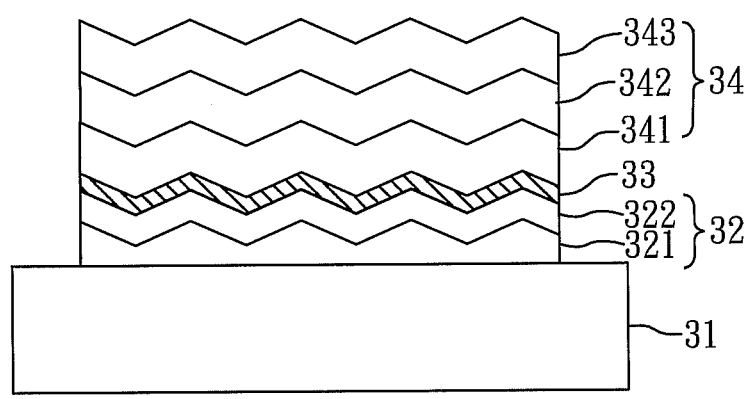

Subsequently, as shown in FIG. 4C, the present example utilized ECRCVD and modified the microwave power to form an intrinsic layer 34 with gradually decreasing bandgaps from the side of the n-type amorphous/nano-microcrystalline silicon layer (i.e. gradually increasing bandgaps from the side of the subsequent p-type amorphous silicon layer) on the first doped semiconductor layer 33. In detail, a first amorphous/nanocrystalline silicon layer 341, a second amorphous/nanocrystalline silicon layer 342 and a third amorphous/nanocrystalline silicon layer 343 were formed on the p-type amorphous silicon layer in sequence by modifying the microwave power in a constant condition as follows: the substrate temperature of about 250° C., the deposition pressure of about 20 mTorr, the He flow of about 16 sccm, the $H_2$ flow of about 45 sccm and the $SiH_4$ flow of anout 5 sccm. Herein, the first amorphous/nanocrystalline silicon layer 341 of about 1000 Å in thickness, about 80-100 Å in average grain size and about 1.6 eV in bandgap was grown under the microwave power of about 700-900 W; the second amorphous/nanocrystalline silicon layer 342 of about 1000 Å in thickness, about 100 Å in average grain size and about 1.5 eV in bandgap was grown under the microwave power of about 1000-1100 W; and the third amorphous/nanocrystalline silicon layer 343 of about 1000 Å in thickness, about 100-120 Å in average grain size and about 1.4 eV in bandgap was grown under the microwave power of about 1300 W. In addition, after forming the first amorphous/nanocrystalline silicon layer 341, the second amorphous/nanocrystalline silicon layer 342 and the third amorphous/nanocrystalline silicon layer 343, a process of rapid thermal annealing (RTA) can be optionally performed to stabilize the grain size and uniformity. In RTA, the temperature was set in the range from about 650° C. to 850° C., and the process time was about 1.5 minutes. Accordingly, the present example manufactured an intrinsic layer 34 with gradually increasing bandgaps from the side of the p-type amorphous silicon layer in a thickness of about 3000 Å.

Figure 4D:
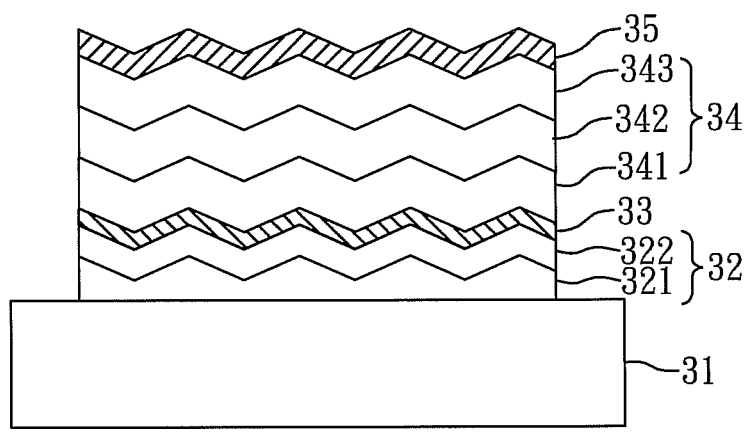

Then, as shown FIG. 4D, a second doped semiconductor layer 35 was formed on the intrinsic layer 34 by ECRCVD. In detail, a p-type amorphous silicon layer of about 300 Å in thickness was grown as the second doped semiconductor layer 35 in the condition as follows: the substrate temperature of about 250° C., the microwave power of about 1000 W, the deposition pressure of about 20 mTorr, the He flow of about 20 sccm, the $H_2$ flow of about 80 sccm, the $SiH_4$ flow of about 10 sccm, and the $B_2H_6$:He (98:2) flow of about 5-15 sccm. Accordingly, the present example manufactured a p-type amorphous silicon layer of about 500 Å in thickness and about 1.7 eV in bandgap as the second doped semiconductor layer 35.

Figure 4E:
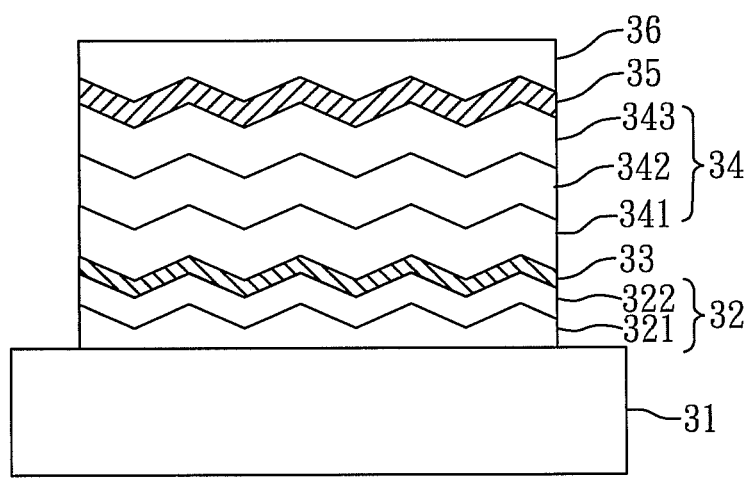

Finally, as shown in FIG. 4E, a second electrode 36 was formed on the second doped semiconductor layer 35. Herein, ITO (i.e. a second transparent oxide layer) was coated on the second doped semiconductor layer 35 as the second electrode 36 by sputtering.

EXAMPLE 3

Figure 5A:
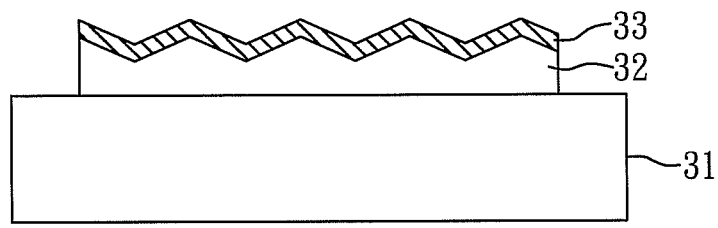
FIGS. 5A to 5C show cross-sectional views for illustrating a method for manufacturing a silicon thin-film silicon solar cell according to yet another preferred example of the present invention.
Figure 5B:
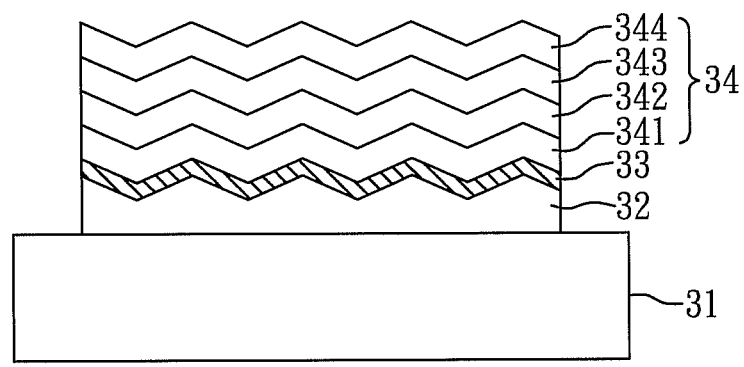
Figure 5C:
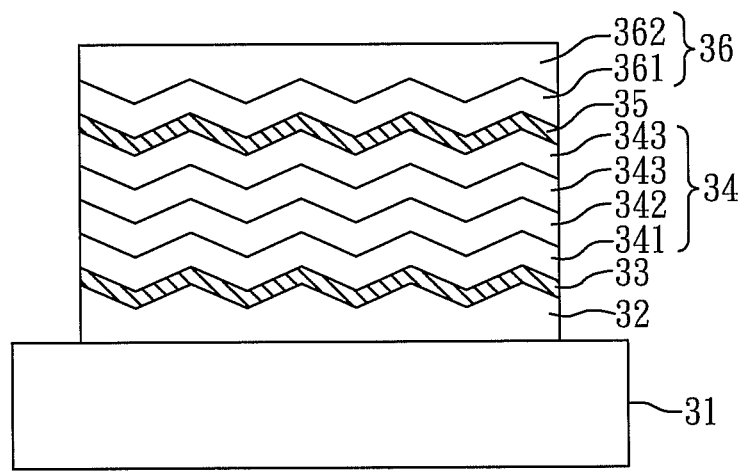

FIGS. 5A to 5C show cross-sectional views for illustrating the method for manufacturing a silicon thin-film solar cell according to the present example.

First, a structure as shown in FIG. 5A was fabricated by the process illustrated in FIGS. 3A to 3B.

Subsequently, as shown in FIG. 5B, the present example utilized ECRCVD and modified the microwave power and the substrate temperature to form an intrinsic layer 34 with bandgaps varied in an approximate V-shaped trend from the side of the p-type amorphous silicon layer on the first doped semiconductor layer 33. In detail, a first amorphous/nanocrystalline silicon layer 341, a second amorphous/nanocrystalline silicon layer 342, a third amorphous/nanocrystalline silicon layer 343 and a fourth amorphous/nanocrystalline silicon layer 344 were formed on the p-type amorphous silicon layer in sequence by modifying the substrate temperature and the microwave power in a constant condition as follows: the deposition pressure of about 20 mTorr, the He flow of about 16 sccm, the $H_2$ flow of about 45 sccm and the $SiH_4$ flow of about 5 sccm. Herein, the first amorphous/nanocrystalline silicon layer 341 of about 1000 Å in thickness, about 80-100 Å in average grain size and about 1.6 eV in bandgap was grown in the condition of the microwave power being about 1000 W and the substrate temperature being 300° C.; the second amorphous/nanocrystalline silicon layer 342 of about 1000 Å in thickness, about 100-120 Å in average grain size and about 1.4 eV in bandgap was grown in the condition of the microwave power being about 1300 W and the substrate temperature being 250° C.; the third amorphous/nanocrystalline silicon layer 343 of about 1000 Å in thickness, about 100 Å in average grain size and about 1.5 eV in bandgap was grown in the condition of the microwave power being about 1100 W and the substrate temperature being 300° C.; and the fourth amorphous/nanocrystalline silicon layer 344 of about 1000 Å in thickness, about 80-100 Å in average grain size and about 1.6 eV in bandgap was grown in the condition of the microwave power being about 1000 W and the substrate temperature being 300° C. In addition, after forming the first amorphous/nanocrystalline silicon layer 341, the second amorphous/nanocrystalline silicon layer 342, the third amorphous/nanocrystalline silicon layer 343 and the fourth amorphous/nanocrystalline silicon layer 344, a process of rapid thermal annealing (RTA) can be optionally performed to stabilize the grain size and uniformity. In RTA, the temperature was set in the range from about 650° C. to 850° C., and the process time was about 1.5 minutes. Accordingly, the present example manufactured an intrinsic layer 34 with bandgaps varied in an approximate V-shaped trend from the side of the p-type amorphous silicon layer in a thickness of about 4000 Å. Herein, the fourth amorphous/nanocrystalline silicon layer 344 adjacent to the n-type amorphous/nano-microcrystalline silicon layer had the same bandgap as the first amorphous/nanocrystalline silicon layer 341 adjacent to the p-type amorphous silicon layer.

Finally, as shown in FIG. 5C, a second doped semiconductor 35 and a second electrode 36 were formed on the intrinsic layer 34 in sequence by the process illustrated in FIGS. 3F to 3G according to Example 1.

EXAMPLE 4

The manufacturing method according to the present example was almost the same as that illustrated in Example 3, except that the first amorphous/nanocrystalline silicon layer 341 of about 1000 Å in thickness, about 100 Å in average grain size and about 1.5 eV in bandgap was grown in the condition of the microwave power being about 1100 W and the substrate temperature being 300° C.; the second amorphous/nanocrystalline silicon layer 342 of about 1000 Å in thickness, about 100-120 Å in average grain size and about 1.4 eV in bandgap was grown in the condition of the microwave power being about 1300 W and the substrate temperature being 250° C.; the third amorphous/nanocrystalline silicon layer 343 of about 1000 Å in thickness, about 100 Å in average grain size and about 1.5 eV in bandgap was grown in the condition of the microwave power being about 1100 W and the substrate temperature being 300° C.; and the fourth amorphous/nanocrystalline silicon layer 344 of about 1000 Å in thickness, about 80-100 Å in average grain size and about 1.6 eV in bandgap was grown in the condition of the microwave power being about 1000 W and the substrate temperature being 300° C. Accordingly, the present example manufactured an intrinsic layer 34 with bandgaps varied in an approximate V-shaped trend from the side of the p-type amorphous silicon layer in a thickness of about 4000 Å. Herein, the fourth amorphous/nanocrystalline silicon layer 344 adjacent to the n-type amorphous/nano-microcrystalline silicon layer had a larger bandgap than the first amorphous/nanocrystalline silicon layer 341 adjacent to the p-type amorphous silicon layer, and the first amorphous/nanocrystalline silicon layer 341 had the same bandgap as the third amorphous/nanocrystalline silicon layer 343.

EXAMPLE 5

Figure 6A:
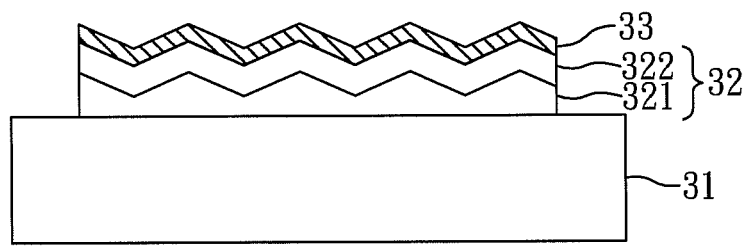
FIGS. 6A to 6C show cross-sectional views for illustrating a method for manufacturing a silicon thin-film silicon solar cell according to still another preferred example of the present invention.
Figure 6B:
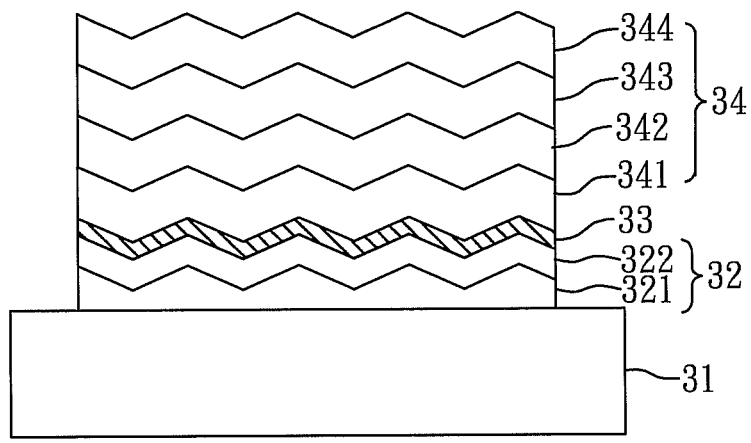
Figure 6C:
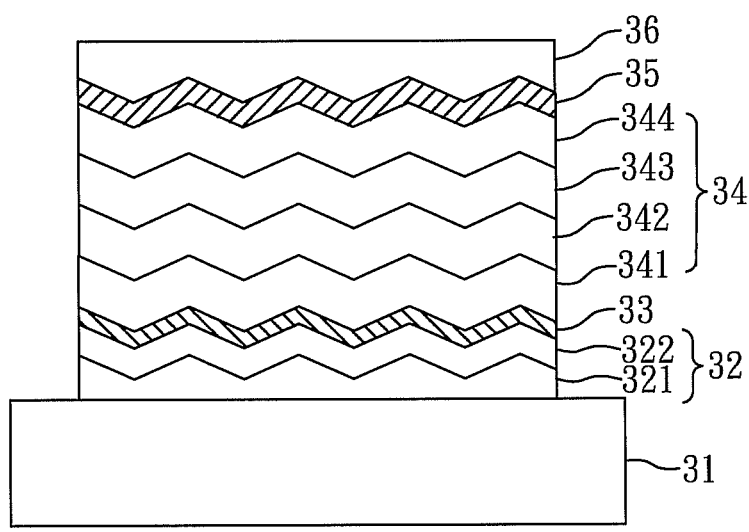

FIGS. 6A to 6C show cross-sectional views for illustrating the method for manufacturing a silicon thin-film solar cell according to the present example.

First, a structure as shown in FIG. 4A was fabricated by the process illustrated in FIGS. 4A to 4B according to Example 2.

Subsequently, as shown in FIG. 6B, the present example utilized ECRCVD and modified the microwave power and the deposition pressure to form an intrinsic layer 34 with bandgaps varied in an approximate V-shaped trend from the side of the p-type amorphous silicon layer on the first doped semiconductor layer 33. In detail, a first amorphous/nanocrystalline silicon layer 341, a second amorphous/nanocrystalline silicon layer 342, a third amorphous/nanocrystalline silicon layer 343 and a fourth amorphous/nanocrystalline silicon layer 344 were formed on the p-type amorphous silicon layer in sequence by modifying the deposition pressure and the microwave power in a constant condition as follows: the substrate temperature of about 250° C., the He flow of about 16 sccm, the $H_2$ flow of about 45 sccm and the $SiH_4$ flow of about 5 sccm. Herein, the first amorphous/nanocrystalline silicon layer 341 of about 1000 Å in thickness, about 100 Å in average grain size and about 1.5 eV in bandgap was grown in the condition of the microwave power being about 1200 W and the deposition pressure being 15 mTorr; the second amorphous/nanocrystalline silicon layer 342 of about 1000 Å in thickness, about 150-180 Å in average grain size and about 1.3 eV in bandgap was grown in the condition of the microwave power being about 1500 W and the deposition pressure being 10 mTorr; the third amorphous/nanocrystalline silicon layer 343 of about 1000 Å in thickness, about 100 Å in average grain size and about 1.5 eV in bandgap was grown in the condition of the microwave power being about 1200 W and the deposition pressure being 15 mTorr; and the fourth amorphous/nanocrystalline silicon layer 344 of about 1000 Å in thickness, about 80-100 Å in average grain size and about 1.6 eV in bandgap was grown in the condition of the microwave power being about 1000 W and the deposition pressure being 20 mTorr. In addition, after forming the first amorphous/nanocrystalline silicon layer 341, the second amorphous/nanocrystalline silicon layer 342, the third amorphous/nanocrystalline silicon layer 343 and the fourth amorphous/nanocrystalline silicon layer 344, a process of rapid thermal annealing (RTA) can be optionally performed to stabilize the grain size and uniformity. In RTA, the temperature was set in the range from about 650° C. to 850° C., and the process time was about 1.5 minutes. Accordingly, the present example manufactured an intrinsic layer 34 with bandgaps varied in an approximate V-shaped trend from the side of the p-type amorphous silicon layer in a thickness of about 4000 Å. Herein, the fourth amorphous/nanocrystalline silicon layer 344 adjacent to the p-type amorphous silicon layer had a larger bandgap than the first amorphous/nanocrystalline silicon layer 341 adjacent to the n-type amorphous/nano-microcrystalline silicon layer, and the first amorphous/nanocrystalline silicon layer 341 has the same bandgap as the third amorphous/nanocrystalline silicon layer 343.

Finally, as shown in FIG. 6C, a second doped semiconductor 35 and a second electrode 36 were formed on the intrinsic layer 34 in sequence by the process illustrated in FIGS. 4D to 4E according to Example 2.

EXAMPLE 6

The manufacturing method according to the present example was almost the same as that illustrated in Example 3, except that an intrinsic layer 34 with bandgaps varied in an approximate U-shaped trend from the side of the p-type amorphous silicon layer on the first doped semiconductor layer 33 by modifying the ratio of $SiH_4:H_2$ and the substrate temperature under constant $CF_4$ flow.

In detail, as shown in FIG. 5B, a first amorphous/nanocrystalline silicon layer 341, a second amorphous/nanocrystalline silicon layer 342, a third amorphous/nanocrystalline silicon layer 343 and a fourth amorphous/nanocrystalline silicon layer 344 were formed on the first doped semiconductor layer 33 in sequence by modifying the ratio of $SiH_4:H_2$ and the substrate temperature in a constant condition as follows: the microwave power of about 1150 W, the deposition pressure of about 20 mTorr, the He flow of about 16 sccm and the $CF_4$ flow of about 5 sccm. Herein, the first amorphous/nanocrystalline silicon layer 341 of about 700 Å in thickness, about 80-100 Å in average grain size and about 1.6 eV in bandgap was grown in the condition of the $SiH_4$ flow and the $H_2$ flow respectively being about 8 sccm and 200 sccm (i.e. $H_2/SiH_4+H_2$ being 96%) and the substrate temperature being 300° C.; the second amorphous/nanocrystalline silicon layer 342 of about 2100 Å in thickness, about 100-120 Å in average grain size and about 1.4 eV in bandgap was grown in the condition of the $SiH_4$ flow and the $H_2$ flow respectively being about 5 sccm and 200 sccm (i.e. $H_2/SiH_4+H_2$ being 97.6%) and the substrate temperature being 250° C.; the third amorphous/nanocrystalline silicon layer 343 of about 700 Å in thickness, about 80-100 Å in average grain size and about 1.6 eV in bandgap was grown in the condition of the $SiH_4$ flow and the $H_2$ flow respectively being about 8 sccm and 200 sccm (i.e. $H_2/SiH_4+H_2$ being 96%) and the substrate temperature being 300° C.; and the fourth amorphous/nanocrystalline silicon layer 344 of about 700 Å in thickness, about 80 Å in average grain size and about 1.7 eV in bandgap was grown in the condition of the $SiH_4$ flow and the $H_2$ flow respectively being about 10 sccm and 200 sccm (i.e. $H_2/SiH_4+H_2$ being 95.2%) and the substrate temperature being 350° C. Accordingly, the present example manufactured an intrinsic layer 34 with bandgaps varied in an approximate U-shaped trend from the side of the p-type amorphous silicon layer in a thickness of about 4200 Å. Herein, the fourth amorphous/nanocrystalline silicon layer 344 adjacent to the n-type amorphous/nano-microcrystalline silicon layer had a larger bandgap than the first amorphous/nanocrystalline silicon layer 341 adjacent to the p-type amorphous silicon layer, and the first amorphous/nano crystalline silicon layer 341 has the same bandgap as the third amorphous/nanocrystalline silicon layer 343.

EXAMPLE 7

The manufacturing method according to the present example was almost the same as that illustrated in Example 1, except that an intrinsic layer 34 with bandgaps varied in an approximate U-shaped trend from the side of the p-type amorphous silicon layer on the first doped semiconductor layer 33 by modifying the ratio of $SiH_4:H_2$ and the substrate temperature under constant $CF_4$ flow.

In detail, as shown in FIGS. 3C to 3E, a first amorphous/nanocrystalline silicon layer 341, a second amorphous/nanocrystalline silicon layer 342 and a third amorphous/nanocrystalline silicon layer 343 were formed on the first doped semiconductor layer 33 in sequence by modifying the ratio of $SiH_4:H_2$ and the substrate temperature in a constant condition as follows: the microwave power of about 1150 W, the deposition pressure of about 20 mTorr, the He flow of about 16 sccm and the $CF_4$ flow of about 5 sccm. Herein, the first amorphous/nanocrystalline silicon layer 341 of about 700 Å in thickness, about 80-100 Å in average grain size and about 1.6 eV in bandgap was grown in the condition of the $SiH_4$ flow and the $H_2$ flow respectively being about 8 sccm and 200 sccm (i.e. $H_2/SiH_4+H_2$ being 96%) and the substrate temperature being 300° C.; the second amorphous/nanocrystalline silicon layer 342 of about 2100 Å in thickness, about 100-120 Å in average grain size and about 1.4 eV in bandgap was grown in the condition of the $SiH_4$ flow and the $H_2$ flow respectively being about 5 sccm and 200 sccm (i.e. $H_2/SiH_4+H_2$ being 97.6%) and the substrate temperature being 250° C.; and the third amorphous/nanocrystalline silicon layer 343 of about 700 Å in thickness, about 80-100 Å in average grain size and about 1.6 eV in bandgap was grown in the condition of the $SiH_4$ flow and the $H_2$ flow respectively being about 8 sccm and 200 sccm (i.e. $H_2/SiH_4+H_2$ being 96%) and the substrate temperature being 300° C. Accordingly, the present example manufactured an intrinsic layer 34 with bandgaps varied in an approximate U-shaped trend from the side of the p-type amorphous silicon layer in a thickness of about 3500 Å. Herein, the fourth amorphous/nanocrystalline silicon layer 343 adjacent to the n-type amorphous/nano-microcrystalline silicon layer had the same bandgap as the first amorphous/nanocrystalline silicon layer 341 adjacent to the p-type amorphous silicon layer.

EXAMPLE 8

The manufacturing method according to the present example was almost the same as that illustrated in Example 5, except that an intrinsic layer 34 with bandgaps varied in an approximate U-shaped trend from the side of the p-type amorphous silicon layer on the first doped semiconductor layer 33 by modifying the ratio of $SiH_4:H_2$ and the substrate temperature under constant $CF_4$ flow.

In detail, as shown in FIG. 6B, a first amorphous/nanocrystalline silicon layer 341, a second amorphous/nanocrystalline silicon layer 342, a third amorphous/nanocrystalline silicon layer 343 and a fourth amorphous/nanocrystalline silicon layer 344 were formed on the first doped semiconductor layer 33 in sequence by modifying the ratio of $SiH_4:H_2$ and the substrate temperature in a constant condition as follows: the microwave power of about 1150 W, the deposition pressure of about 20 mTorr, the He flow of about 16 sccm and the $CF_4$ flow of about 5 sccm. Herein, the first amorphous/nanocrystalline silicon layer 341 of about 700 Å in thickness, about 80-100 Å in average grain size and about 1.6 eV in bandgap was grown in the condition of the $SiH_4$ flow and the $H_2$ flow respectively being about 8 sccm and 200 sccm (i.e. $H_2/SiH_4+H_2$ being 96%) and the substrate temperature being 300° C.; the second amorphous/nanocrystalline silicon layer 342 of about 2100 Å in thickness, about 100-120 Å in average grain size and about 1.4 eV in bandgap was grown in the condition of the $SiH_4$ flow and the $H_2$ flow respectively being about 5 sccm and 200 sccm (i.e. $H_2/SiH_4+H_2$ being 97.6%) and the substrate temperature being 250° C.; the third amorphous/nanocrystalline silicon layer 343 of about 700 Å in thickness, about 90 Å in average grain size and about 1.5 eV in bandgap was grown in the condition of the $SiH_4$ flow and the $H_2$ flow respectively being about 8 sccm and 200 sccm (i.e. $H_2/SiH_4+H_2$ being 96%) and the substrate temperature being 275° C.; and the fourth amorphous/nanocrystalline silicon layer 344 of about 700 Å in thickness, about 80 Å in average grain size and about 1.6-1.7 eV in bandgap was grown in the condition of the $SiH_4$ flow and the $H_2$ flow respectively being about 10 sccm and 200 sccm (i.e. $H_2/SiH_4+H_2$ being 95.2%) and the substrate temperature being 350° C. Accordingly, the present example manufactured an intrinsic layer 34 with bandgaps varied in an approximate U-shaped trend from the side of the p-type amorphous silicon layer in a thickness of about 4200 Å. Herein, the fourth amorphous/nanocrystalline silicon layer 344 adjacent to the p-type amorphous silicon layer had a larger bandgap than the first amorphous/nanocrystalline silicon layer 341 adjacent to the n-type amorphous silicon layer.

Accordingly, the silicon thin-film solar cell manufactured by the present invention can exhibit broadband absorption from UV to IR, improved photoelectric conversion efficiency, enhanced open-circuit voltage (Voc), increased short-circuit current (Jsc), higher filler factor (FF) and longer lifetime. In particular, the solar cell with bandgaps varied in an approximate U-shaped trend according to the present invention can exhibit the best conversion efficiency, high Jsc, reduced recombination of carriers and enhanced lifetime.

The above examples are intended for illustrating the embodiments of the subject invention and the technical features thereof, but not for restricting the scope of protection of the subject invention. The scope of the subject invention is based on the claims as appended.

What is claimed is:

1. A method for manufacturing a silicon thin-film solar cell, comprising:
   providing a substrate;
   forming a first electrode on the substrate;
   forming a first doped semiconductor layer on the first electrode by chemical vapor deposition;
   forming an intrinsic layer on the first doped semiconductor layer by chemical vapor deposition, wherein the intrinsic layer includes a plurality of amorphous/nanocrystalline silicon layers, and the intrinsic layer has various energy bandgaps formed by varying average grain sizes of the amorphous/nanocrystalline silicon layers;
   forming a second doped semiconductor layer on the intrinsic layer by chemical vapor deposition, wherein one of the first doped semiconductor layer and the second doped semiconductor layer is a p-type amorphous silicon layer and the other is an n-type amorphous/nano-microcrystalline silicon layer; and
   forming a second electrode on the second doped semiconductor layer.

2. The method as claimed in claim 1, wherein the chemical vapor deposition is electron cyclotron plasma-enhanced chemical vapor deposition.

3. The method as claimed in claim 2, wherein the energy bandgaps of the intrinsic layer vary in an increasing trend, a decreasing trend, or a decreasing and then increasing trend from the p-type amorphous silicon layer to the n-type amorphous/nano-microcrystalline silicon layer.

4. The method as claimed in claim 3, wherein the amorphous/nanocrystalline silicon layers have the same thickness, or the amorphous/nanocrystalline silicon layer with the lowest energy bandgap has the largest thickness.

5. The method as claimed in claim 4, wherein the energy bandgaps of the intrinsic layer vary in a decreasing and then increasing trend from the p-type amorphous silicon layer to the n-type amorphous/nano-microcrystalline silicon layer, and the amorphous/nanocrystalline silicon layer adjacent to the p-type amorphous silicon layer may have a larger bandgap than the amorphous/nanocrystalline silicon layer adjacent to the n-type amorphous/nano-microcrystalline silicon layer.

6. The method as claimed in claim 4, wherein the energy bandgaps of the intrinsic layer vary in a decreasing and then increasing trend from the p-type amorphous silicon layer to the n-type amorphous/nano-microcrystalline silicon layer, and the amorphous/nanocrystalline silicon layer adjacent to the p-type amorphous silicon layer may have a smaller bandgap than the amorphous/nanocrystalline silicon layer adjacent to the n-type amorphous/nano-microcrystalline silicon layer.

7. The method as claimed in claim 4, wherein the energy bandgaps of the intrinsic layer vary in a decreasing and then increasing trend from the p-type amorphous silicon layer to the n-type amorphous/nano-microcrystalline silicon layer, and the amorphous/nanocrystalline silicon layer adjacent to the p-type amorphous silicon layer may have the same bandgap as the amorphous/nanocrystalline silicon layer adjacent to the n-type amorphous/nano-microcrystalline silicon layer.

8. The method as claimed in claim 3, wherein the amorphous/nanocrystalline silicon layers are grown by an electron cyclotron plasma-enhanced chemical vapor deposition system under a deposition temperature of 60° C. to 350° C., a microwave power of 500 W to 1500 W, a deposition pressure of 1 mTorr to 30 mTorr, and a flow ratio of $H_2$/(silicon source+$H_2$) of 0% to 98%.

9. The method as claimed in claim 8, wherein the $H_2$ flow ranges from 0 sccm to 300 sccm, and the silicon source flow ranges from 5 sccm to 30 sccm.

10. The method as claimed in claim 8, wherein the average grain sizes of the amorphous/nanocrystalline silicon layers are varied by altering the flow ratio of $H_2$/(silicon source+$H_2$).

11. The method as claimed in claim 8, wherein the average grain sizes of the amorphous/nanocrystalline silicon layers are varied by altering the microwave power.

12. The method as claimed in claim 8, wherein the average grain sizes of the amorphous/nanocrystalline silicon layers are varied by altering the flow ratio of $H_2$/(silicon source+$H_2$) and the deposition temperature under a $CF_4$ flow.

13. The method as claimed in claim 12, wherein the $CF_4$ flow ranges from 2 sccm to 5 sccm.

14. The method as claimed in claim 8, wherein the average grain sizes of the amorphous/nanocrystalline silicon layers are varied by altering the microwave power and the deposition temperature.

15. The method as claimed in claim 1, wherein each of the amorphous/nanocrystalline silicon layers has an average grain size from 20 Å to 200 Å.

16. The method as claimed in claim 1, wherein the n-type amorphous/nano-microcrystalline silicon layer has an average grain size from 200 Å to 400 Å.

17. The method as claimed in claim 1, wherein the substrate is a transparent substrate, the first doped semiconductor layer is the p-type amorphous silicon layer, and the second doped semiconductor layer is the n-type amorphous/nano-microcrystalline silicon layer.

18. The method as claimed in claim 1, wherein the substrate is an opaque substrate, the first doped semiconductor layer is the n-type amorphous/nano-microcrystalline silicon layer, and the second doped semiconductor layer is the p-type amorphous silicon layer.

* * * * *